(12) United States Patent
Ermolov et al.

(10) Patent No.: US 8,822,843 B2
(45) Date of Patent: Sep. 2, 2014

(54) APPARATUS AND ASSOCIATED METHODS

(75) Inventors: Vladimir Ermolov, Espoo (FI);
Markku Anttoni Oksanen, Helsinki (FI); Martti Voutilainen, Espoo (FI)

(73) Assignee: Nokia Corporation, Espoo (FI)

( * ) Notice: Subject to any disclaimer, the term of this patent is extended or adjusted under 35 U.S.C. 154(b) by 572 days.

(21) Appl. No.: 13/041,746

(22) Filed: Mar. 7, 2011

(65) Prior Publication Data
US 2012/0228019 A1 Sep. 13, 2012

(51) Int. Cl.
*H05K 9/00* (2006.01)
*H05K 1/03* (2006.01)
*H05K 1/09* (2006.01)
*H05K 7/18* (2006.01)
*B82Y 30/00* (2011.01)
*H05K 1/02* (2006.01)

(52) U.S. Cl.
CPC . *H05K 1/09* (2013.01); *B82Y 30/00* (2013.01); *H05K 1/0245* (2013.01); *H05K 2201/026* (2013.01); *H05K 1/0218* (2013.01)
USPC .......... 174/377; 174/255; 174/257; 361/799; 361/800; 361/816; 361/818

(58) Field of Classification Search
CPC .................................................... H05K 3/321
USPC .......... 174/350, 255, 257, 259, 261; 361/799, 361/800, 816, 818; 977/742, 752, 832
See application file for complete search history.

(56) References Cited

U.S. PATENT DOCUMENTS

| | | | |
|---|---|---|---|
| 7,118,693 B2 | 10/2006 | Glatkowski et al. | 252/502 |
| 2006/0006884 A1* | 1/2006 | Yamada et al. | 324/724 |
| 2006/0113511 A1* | 6/2006 | Chen | 252/500 |
| 2007/0278448 A1* | 12/2007 | Chari et al. | 252/299.01 |
| 2008/0012155 A1 | 1/2008 | Raravikar et al. | 257/789 |
| 2008/0156522 A1* | 7/2008 | Shimada | 174/262 |
| 2009/0189711 A1* | 7/2009 | Emrick et al. | 333/109 |
| 2009/0277680 A1 | 11/2009 | Lee et al. | 174/377 |
| 2011/0005819 A1 | 1/2011 | Chang et al. | 174/258 |
| 2011/0008240 A1 | 1/2011 | Inoue et al. | 423/447.7 |

OTHER PUBLICATIONS

C. Kim et al., "A Novel 1-D Periodic Defected Ground Structure for Planar Circuits", IEEE Microwave and Guided Wave Letters, vol. 10, No. 4 Apr. 2000 pp. 131-133.
W. Liu, et al., "An Embedded Common-Mode Suppression Filter for GHz Differential Signals Using Periodic Defected Ground Plane", IEEEE Microwave and Wireless Components Letters, vol. 18, No. 4, Apr. 2008, pp. 248-250.
S. Wu et al., "A Novel Wideband Common-Mode Suppression Filter for Gigahertz Differential Signals Using Coupled Patterned Ground Structure" IEEE Transaction on Microwave Theory and Techniques, vol. 57, No. 4, Apr. 2009 pp. 848-855.

(Continued)

*Primary Examiner* — Timothy Thompson
*Assistant Examiner* — Sherman Ng
(74) *Attorney, Agent, or Firm* — Harrington & Smith

(57) ABSTRACT

A printed wiring board including a conductive layer, the conductive layer including a network of nanotubes with respective longitudinal axes, the nanotubes arranged such that their longitudinal axes are aligned substantially parallel to one another in a configuration such that electrical current passing through the conductive layer along a first axis substantially parallel to the longitudinal axes of the nanotubes experiences one degree of dissipation, and electrical current passing through the conductive layer along a second axis experiences a higher degree of dissipation.

11 Claims, 7 Drawing Sheets

(56) References Cited

OTHER PUBLICATIONS

K. Moon et al., "Ferrite Polymer Composite for Improving the Electromagnetic Compatability of Semiconductor Packaging", Journal of Electronic Materials, vol. 36, No. 12, Sep. 2007 pp. 1711-1718.

T. Jarvis, Radio Cad "A PCB Design Approach for Best EMC", Jun. 22, 2004.

X. Wang et al., "Room-Temperature All Semiconducting Sub-10-nm Graphene Nanoribbon Field-Effect Transistors", Physical Review Letters, PRL 100, 206803 (2008), May 23, 2008, The American Physical Society.

Y. Shigeyoshi et al., "High-Frequency Noise Suppression Using Ferrite-Plated Film", NEC Technical Journal, vol. 1, No. May 2006, pp. 77-81.

* cited by examiner

APPARATUS AND ASSOCIATED METHODS

TECHNICAL FIELD

The present disclosure relates to the field of electromagnetic compatibility, associated methods and apparatus, and in particular concerns a network of nanotubes configured to control unwanted electromagnetic energy within printed wiring boards. Certain disclosed example aspects/embodiments relate to portable electronic devices, in particular, so-called hand-portable electronic devices which may be hand-held in use (although they may be placed in a cradle in use). Such hand-portable electronic devices include so-called Personal Digital Assistants (PDAs).

The portable electronic devices/apparatus according to one or more disclosed example aspects/embodiments may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Driving different lengths of printed wiring board (PWB) trace using similar drivers can result in excess current in the shorter traces. This excess current gives rise to unwanted electromagnetic fields which can interfere with signals in adjacent traces. The damaging effects of electromagnetic interference pose unacceptable risks for many electronic devices, so it is desirable to control such interference and reduce the risks to acceptable levels. Controlling electromagnetic interference typically involves reducing the sources of interference, as well as increasing the immunity of adjacent electronics to the electromagnetic fields.

The apparatus and associated methods disclosed herein may or may not address one or more of these issues.

The listing or discussion of a prior-published document or any background in this specification should not necessarily be taken as an acknowledgement that the document or background is part of the state of the art or is common general knowledge. One or more aspects/embodiments of the present disclosure may or may not address one or more of the background issues.

SUMMARY

According to a first aspect, there is provided a printed wiring board comprising a conductive layer, the conductive layer comprising a network of nanotubes with respective longitudinal axes, the nanotubes arranged such that their longitudinal axes are aligned substantially parallel to one another in a configuration such that electrical current passing through the conductive layer along a first axis substantially parallel to the longitudinal axes of the nanotubes experiences one degree of dissipation, and electrical current passing through the conductive layer along a second axis experiences a higher degree of dissipation.

The second axis may be substantially perpendicular to the longitudinal axes of the nanotubes. The first and second axes may lie substantially in the same plane. The conductive layer may have a planar structure. The first and second axes may lie substantially in the plane of the conductive layer.

The printed wiring board may be configured such that the conductive layer serves as a ground layer when electrical current is passed through the conductive layer along the first axis, and as a lossy layer when electrical current is passed through the conductive layer along the second axis.

The conductive layer may be configured to have an anisotropic electrical conductivity. The ratio of electrical conductivity along the first and second axes, respectively, may be less than or equal to 10:1.

The current may be an alternating current having a frequency of up to 50 GHz.

The square resistivity of the conductive layer may be no greater than 13 Ω/square for an electrical current passing through the conductive layer along the first axis.

The average diameter of each nanotube may be no greater than 25 nm. The average kinetic inductance of each nanotube may be no greater than 0.5 nH/μm. The nanotubes may be one or more of the following: nanowires, single-walled nanotubes, and multi-walled nanotubes. The nanowires, single-walled nanotubes, and multi-walled nanotubes may be carbon nanowires, single-walled carbon nanotubes, and multi-walled carbon nanotubes, respectively.

The conductive layer may comprise a supporting material configured to increase the mechanical integrity of the conductive layer. The supporting material may comprise a polymer. The conductive layer may comprise an adhesive to facilitate adhesion of the conductive layer to another layer of the printed wiring board. The supporting material may facilitate adhesion of the conductive layer to another layer of the printed wiring board.

The printed wiring board may comprise a second conductive layer. The second conductive layer may comprise a network of nanotubes with respective longitudinal axes. The nanotubes may be arranged such that their longitudinal axes are aligned substantially parallel to one another. The second conductive layer may be configured to shield the printed wiring board from electromagnetic interference. The nanotubes of the second conductive layer may be aligned substantially perpendicular to the nanotubes of the conductive layer.

The printed wiring board may comprise a signal strip. The nanotubes may have first and third portions where their longitudinal axes are aligned substantially parallel to one another. The nanotubes may have a second portion where the nanotubes are configured to form a disturbance in the parallel alignment adjacent the signal strip to couple common-mode current flowing in the conductive layer.

The network may be configured to comprise a predefined disturbance in the parallel alignment to provide a particular impedance value for the conductive layer.

Two or more of, the nanotubes configured to dissipate electrical current, the nanotubes configured to couple common-mode current, and the nanotubes configured to provide a particular impedance value, may be located in different layers of the printed circuit board. On the other hand, two or more of, the nanotubes configured to dissipate electrical current, the nanotubes configured to couple common-mode current, and the nanotubes configured to provide a particular impedance value, may be located in the same layer of the printed circuit board.

According to a further aspect, there is provided a printed wiring board comprising a signal strip and a ground layer, the ground layer comprising a network of nanotubes with respective longitudinal axes, the nanotubes having first and third portions where their longitudinal axes are aligned substantially parallel to one another, and a second portion where the nanotubes are configured to form a disturbance in the parallel alignment adjacent the signal strip to couple common-mode current flowing in the ground layer.

The disturbance in the parallel alignment may be configured to dissipate the common-mode current.

The network may be configured to comprise a predefined disturbance in the parallel alignment to provide a particular impedance value for the ground layer.

The nanotubes configured to couple common-mode current, and the nanotubes configured to provide a particular impedance value, may be located in different layers of the printed circuit board. On the other hand, the nanotubes configured to couple common-mode current, and the nanotubes configured to provide a particular impedance value, may be located in the same layer of the printed circuit board.

According to a further aspect, there is provided a printed wiring board comprising a ground layer, the ground layer comprising a network of nanotubes with respective longitudinal axes, the nanotubes arranged such that their longitudinal axes are aligned substantially parallel to one another, wherein the network is configured to comprise a predefined disturbance in the parallel alignment to provide a particular impedance value for the ground layer.

The predefined disturbance in the parallel alignment may be configured to provide an impedance value of 50Ω. The network may be configured to comprise a plurality of predefined disturbances in the parallel alignment to provide a particular impedance value for the ground layer. The ground layer may have a planar structure. The plurality of predefined disturbances may be distributed at predefined intervals across the ground layer.

According to a further aspect, there is provided a device comprising any printed wiring board described herein. The device may be one or more of the following: an electronic device, a portable electronic device, a portable telecommunications device, and a module for any of the aforementioned devices.

According to a further aspect, there is provided a method of making a printed wiring board, the method comprising:
 providing a printed wiring board;
 providing a conductive layer, the conductive layer comprising a network of nanotubes with respective longitudinal axes, the nanotubes arranged such that their longitudinal axes are aligned substantially parallel to one another in a configuration such that electrical current passing through the conductive layer along a first axis substantially parallel to the longitudinal axes of the nanotubes experiences one degree of dissipation, and electrical current passing through the conductive layer along a second axis experiences a higher degree of dissipation; and
 attaching the conductive layer to the printed wiring board.

According to a further aspect, there is provided a method of making a printed wiring board, the method comprising:
 providing a printed wiring board, the printed wiring board comprising a signal strip;
 providing a ground layer, the ground layer comprising a network of nanotubes with respective longitudinal axes, the nanotubes having first and third portions where their longitudinal axes are aligned substantially parallel to one another, and a second portion where the nanotubes are configured to form a disturbance in the parallel alignment adjacent the signal strip to couple common-mode current flowing in the ground layer; and
 attaching the ground layer to the printed wiring board.

According to a further aspect, there is provided a method of making a printed wiring board, the method comprising:
 providing a printed wiring board;
 providing a ground layer, the ground layer comprising a network of nanotubes with respective longitudinal axes, the nanotubes arranged such that their longitudinal axes are aligned substantially parallel to one another, wherein the network is configured to comprise a predefined disturbance in the parallel alignment to provide a particular impedance value for the ground layer; and
 attaching the ground layer to the printed wiring board.

The conductive layer/ground layer may be provided by spinning the network of nanotubes from a drawable array of vertical nanotubes. The conductive layer/ground layer may be provided by adding a supporting material to the network of nanotubes. The supporting material may be added to the network of nanotubes by polymerisation of monomers in the space between the nanotubes.

The conductive layer/ground layer may be attached to the printed wiring board by fusing the network of nanotubes to a surface of the printed wiring board during thermal pressing. On the other hand, the conductive layer/ground layer may be attached to the printed wiring board using an adhesive material.

The steps of any method disclosed herein do not have to be performed in the exact order disclosed, unless explicitly stated or understood by the skilled person.

According to a further aspect, there is provided a computer program, recorded on a carrier, the computer program comprising computer code configured to perform any method described herein for making a printed wiring board.

The apparatus may comprise a processor configured to process the code of the computer program. The processor may be a microprocessor, including an Application Specific Integrated Circuit (ASIC).

The present disclosure includes one or more corresponding aspects, example embodiments or features in isolation or in various combinations whether or not specifically stated (including claimed) in that combination or in isolation. Corresponding means for performing one or more of the discussed functions are also within the present disclosure.

Corresponding computer programs for implementing one or more of the methods disclosed are also within the present disclosure and encompassed by one or more of the described example embodiments.

The above summary is intended to be merely exemplary and non-limiting.

BRIEF DESCRIPTION OF THE FIGURES

A description is now given, by way of example only, with reference to the accompanying drawings, in which.

DESCRIPTION OF SPECIFIC
ASPECTS/EMBODIMENTS

Electromagnetic compatibility (EMC) is the branch of electrical science which is concerned with the unintentional generation, propagation and reception of electromagnetic energy, and the unwanted effects that such energy may induce. The goal of EMC is the correct operation of different pieces of electrical equipment in the same electromagnetic environment, and the avoidance of any interference effects.

In order to achieve this, EMC addresses two connected issues: emission and susceptibility. Emission is related to the unwanted generation of electromagnetic energy by a "source", and to the countermeasures which should be taken in order to reduce such generation and to avoid the escape of any remaining energies into the external environment. In contrast, susceptibility refers to the correct operation of electrical equipment, referred to as the "victim", in the presence of unplanned electromagnetic disturbances.

Figure 1:
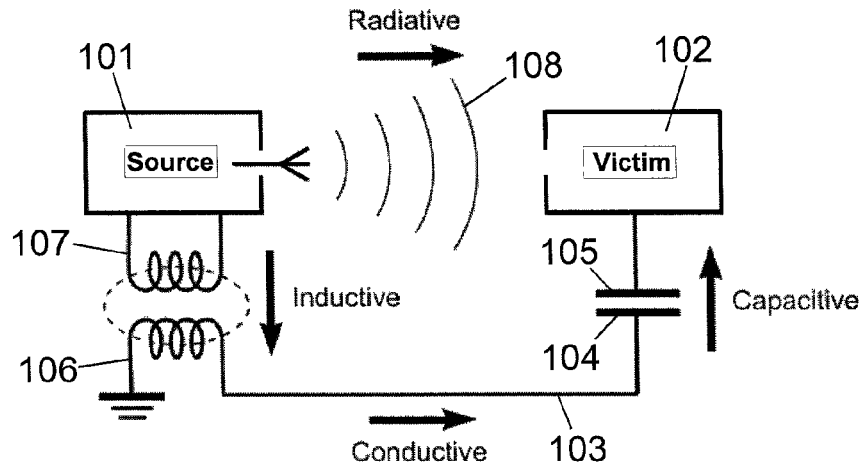
FIG. 1 illustrates schematically the four electromagnetic interference coupling modes.

The basis arrangement of noise source, coupling path, and victim is shown in FIG. 1. Source 101 and victim 102 are usually electronic hardware devices. There are four basic coupling mechanisms: conductive, capacitive, inductive, and radiative coupling. Any coupling path can be broken down into one or more of these coupling mechanisms.

Conductive coupling occurs when the coupling path between the source 101 and the victim 102 is formed by direct contact with a conductive body 103, such as a transmission line, wire, cable, PWB trace, or metal enclosure.

Capacitive coupling occurs when a varying electric field exists between two adjacent conductors 104, 105 which are spaced typically less than a wavelength apart. In this scenario, the electric field induces a change in voltage between the conductors 104, 105.

Inductive coupling, on the other hand, occurs when a varying magnetic field exists between two parallel conductors 106, 107 which are spaced typically less than a wavelength apart. In this scenario, the magnetic field induces a change in voltage along the receiving conductor 107.

Finally, radiative coupling occurs when the source and victim are separated by a large distance, typically more than a wavelength. In this scenario, the source 101 emits an electromagnetic wave 108 which propagates across the open space and is received by the victim 102.

As mentioned in the background section, excess current present in shorter PWB traces gives rise to electromagnetic interference. Depending on the distances between adjacent traces, this excess current may interfere with signals via capacitive, inductive, or radiative coupling mechanisms.

Another source of electromagnetic interference in PWB traces is common mode current, which is often present in differential circuits. Theoretically, a differential circuit (FIG. 2*a*) should not be a source of electromagnetic interference. To illustrate this, we consider a simple two-wire cable, terminated at one end with a load impedance (LOAD). The voltages on each wire relative to ground potential (GND) are denoted $V_1$ and $V_2$, and the differential mode signal component is denoted $V_{DIFF}$.

For pure differential mode signals, $V_1=-V_2$ (i.e. the magnitudes of the signals are equal, but there is a phase difference of 180°), and $V_{DIFF}=V_1-V_2$. In this mode, no current flows to ground because of the symmetry between $V_1$ and $V_2$ about ground, and the instantaneous sum of the two voltages ($V_1+V_2$) is zero. Instead, all differential mode current ($I_D$) flows through the load. In a cable-based transmission system, the differential mode signal is the "wanted" signal that carries information.

In practical circuits, however, there is often timing skew and/or amplitude unbalance along the differential signal paths. These result in common mode signals being produced, as illustrated in FIG. 2*b*. For pure common mode signals, $V_1=V_2=V_{COM}$ (i.e. the magnitudes of the signals are equal and in phase), and $V_3=0$. In this mode, no current flows in the load because there is no potential difference across it, and the instantaneous sum of the two voltages $V_1$ and $V_2$ is non-zero. Instead, all common mode current ($I_C$) flows to GND via parasitic capacitance ($C_P$) between the cable and GND. In a cable-based transmission system, the common mode signal is the "unwanted" signal because it carries no information. The potential of the cable varies with respect to ground and gives rise to electromagnetic radiation.

One way of minimising electromagnetic interference is to dissipate any excess or common mode current travelling in the traces of a PWB using a choke. One type of choke is a ferrite bead, which is commonly used as a passive low-pass filter. The geometry and electromagnetic properties of coiled wire over a ferrite core generates high impedance for high-frequency signals. This can be used to attenuate high frequency electromagnetic interference by reflecting the energy back up the cable, or by absorbing the energy resistively within the ferrite core and dissipating it as heat.

Figure 3A:
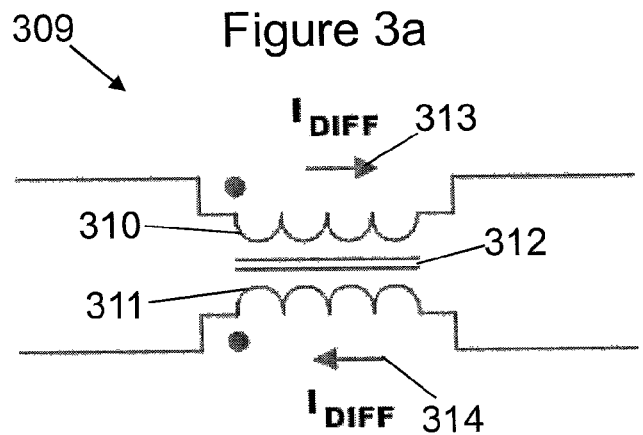
FIG. 3a illustrates schematically the effect of an ideal choke on a differential mode signal.
Figure 3B:
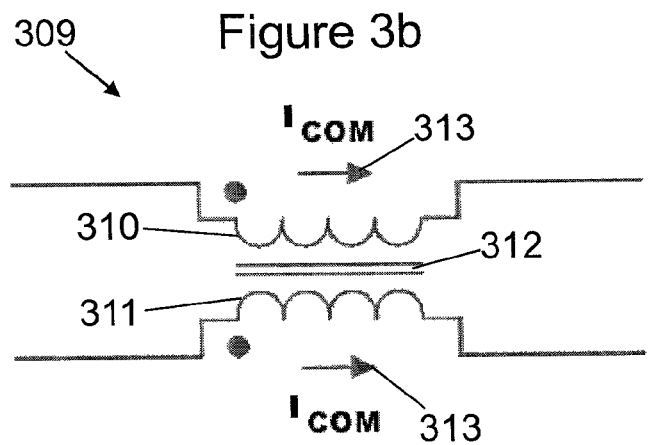
FIG. 3b illustrates schematically the effect of an ideal choke on a common mode signal.

FIGS. 3*a* and 3*b* illustrate the effects of a choke 309 on differential mode and common mode signals, respectively. Here we consider an ideal two winding 310, 311, single core 312 choke 309, and neglect the effects of stray impedance which are always present to a greater or lesser extent in a real choke. This assumption is reasonable because, in a well-designed choke, the stray impedance is negligible compared to the circuit source and load impedance.

With reference to FIG. 3*a*, the differential mode current, $I_{DIFF}$, flowing in opposite directions 313, 314 through the choke windings 310, 311 creates equal and opposite magnetic fields which cancel each other out. This results in the choke 309 presenting zero impedance to the differential mode signal, which passes through the choke 309 unattenuated.

With reference to FIG. 3*b*, the common mode current, $I_{COM}$, flowing in the same direction 313 through each of the choke windings 310, 311 creates equal and in-phase magnetic fields which add together. This results in the choke 309 presenting a high impedance to the common mode signal, which passes through the choke 309 heavily attenuated. The actual attenuation (or common mode rejection) depends on the relative magnitudes of the choke impedance and the load impedance.

A problem with chokes (especially ferrite beads), however, is that they are often unsuitable for use with high frequency (e.g. radio frequencies) AC signals above 1 GHz. There will now be described an apparatus and associated methods which may or may not address this issue.

Figure 4:
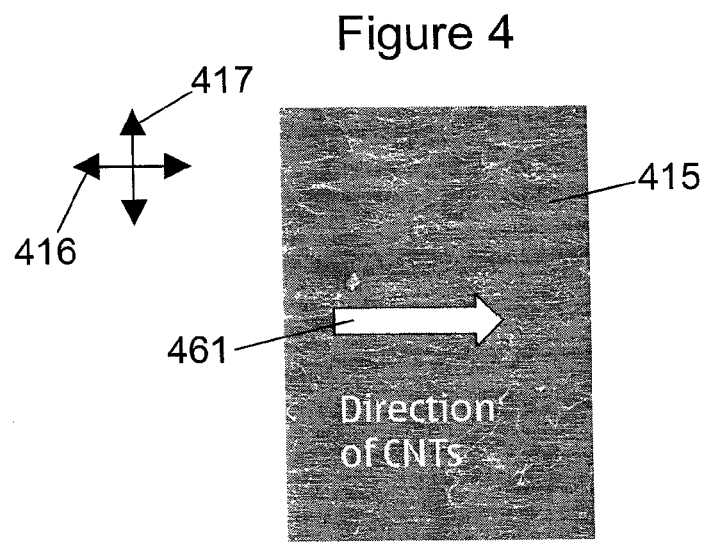
FIG. 4 shows a network of nanotubes configured for use both as a ground layer and as a lossy layer.

The present disclosure incorporates a conductive layer with controlled RF loss properties in the layer stack of a PWB. This allows excess current in the PWB traces to be directed to the lossy layer and absorbed/dissipated. As shown in FIG. 4, the conductive layer comprises a network of nanotubes 415 with respective longitudinal axes. The term "nanotube" may be taken to mean a nanometer-scale tube-like structure with a length-to-width ratio (or a length-to-diameter ratio if cylindrical) of greater than 1:1. The length-to-width or length-to-diameter ratio may be as large as 2:1, 10:1, 100:1, 1000:1, 10,000:1, 100,000:1, 1,000,000:1, 10,000,000:1, or 100,000,000:1. The nanotubes may be cylindrical, but need not be.

The individual nanotubes are capable of conducting electrical current, and are arranged such that their longitudinal axes are aligned substantially parallel to one another. The term "substantially parallel" as used throughout the specification to describe the orientation of the nanotubes may be taken to mean that the nanotubes have an average axis of orientation 461, and the majority of nanotubes within the material have a longitudinal axis oriented at an angle of less than 45° with respect to the average axis of orientation 461. The majority of nanotubes may have a longitudinal axis oriented at an angle of less than 30°, less than 20°, less than 10°, or less than 5° with respect to the average axis of orientation 461.

In this way, the material 415 produced exhibits an anisotropic electrical conductivity such that electrical current passing through the conductive layer along a first axis 416 substantially parallel to the average axis of orientation 461 experiences one degree of dissipation, and electrical current passing through the conductive layer along a second axis 417 experiences a higher degree of dissipation. The term "substantially parallel" as used to describe the orientation of the first axis 416 with respect to the average axis of orientation 461 may be taken to mean that the first axis 416 is oriented at an angle of less than 45° with respect to the average axis of orientation 461. The first axis 416 may be oriented at an angle of less than 30°, less than 20°, less than 10°, or less than 5° with respect to the average axis of orientation 461. Furthermore, the term "dissipation" may be taken to mean that the current is absorbed by the material such that the associated electrical energy is converted to heat.

The use of an anisotropic conductor is advantageous, because the conductive layer can be used as a ground layer when electrical current is passed through the conductive layer along the first axis 416, and as a lossy layer when electrical current is passed through the conductive layer along the second axis 417. Therefore, excess currents and their associated electromagnetic interference can be controlled without the need for any additional layers in the PWB stack.

Unlike the chokes discussed above, the nanotube material 415 can be used to dissipate AC current with frequencies of up to 50 GHz. This renders the material suitable for use in RF applications. Above 50 GHz, however, plasmonic oscillations are excited and reduce the absorption/dissipation of electrical signals.

The nanotubes may be nanowires, single-walled nanotubes or multi-walled nanotubes, and in particular, may be carbon nanowires, single-walled carbon nanotubes or multi-walled carbon nanotubes. Furthermore, the nanotube network 415 may comprise one or more types of nanotube.

The electrical conductivity of a single carbon nanotube is typically greater than the electrical conductivity of most metals. However, in the nanotube networks 415 described herein, the average length of each nanotube is chosen to control the electrical conductivity. By decreasing the average length, a greater number of discontinuities are created in the network, and the electrical conductivity of the material decreases. As the average length of the nanotubes increases, the number of discontinuities decreases, and the electrical conductivity of the nanotube network increases. The nanotubes may have an average length of less than 3 mm, less than 5 mm, less than 10 mm, less than 20 mm, less than 30 mm, less than 40 mm, or less than 50 mm.

Furthermore, there are typically variations in the thickness of the nanotube network 415, resulting in thinner regions with lower electrical conductivity. This makes the material 415 more lossy than a metal sheet of uniform thickness. Therefore, the electrical conductivity can also be varied to some extend by controlling the material thickness and/or the degree of uniformity of the material thickness.

The second (or higher dissipation) axis 417 will typically be an axis which lies perpendicular to the longitudinal axes of the nanotubes. Also, the first 416 (lower dissipation) and second 417 axes will generally lie in the plane of the conductive layer. Due to the substantially parallel alignment of the nanotubes, the material 415 has been found to exhibit an anisotropic electrical conductivity with a ratio of up to 10:1 along the first 416 and second 417 axes, respectively.

It has been found that multi-walled carbon nanotubes can be grown with a resistance of less than $100\Omega$ per μm in length, which is far lower than the 4-6 kΩ per μm in length associated with single-walled carbon nanotubes. This can be attributed to the long mean free paths of electrons in multi-walled carbon nanotubes, which can be up to 65 μm.

The square (or area) resistivity of a single layer of nanotubes is ~50 $\Omega$/N, where N is the number of multi-walled carbon nanotubes per μm across the width of the material 415 (i.e. perpendicular to the longitudinal axes of the parallel nanotubes). If we assume that each nanotube has a diameter of 25 nm, and the nanotubes have a 25 nm centre-to-centre distance from one another (i.e. each nanotube is in direct physical contact with its nearest neighbours), a single layer of nanotubes could have a square resistivity of as low as 12.5Ω. Typical signal strips used today are at least 50 μm wide, and 70% of the return current on the metal ground plane is distributed into the same width as the signal strip. Therefore, if a single layer of nanotubes is used to form the ground plane of a PWB, and the nanotubes are packed together as described above, the return current will flow through 2000 substantially parallel nanotubes.

Another important consideration is inductance (both magnetic and kinetic). Kinetic inductance originates in the kinetic energy required by each electron that is contributing to a flow of current. In general the electrons in a solid are moving around continuously in all possible directions in the material. When a current flows, however, the electric field adds a small drift velocity component to the whole electron distribution which requires the electron system to acquire kinetic energy. In a superconducting or non-superconducting material, this kinetic energy is equivalent mathematically to the energy invested in creating a magnetic field, and is effectively stored until the electrons decelerate again. This is often neglected in non-superconducting materials as their resistance requires that energy continually be applied to sustain the current due to charge carrier scattering (i.e. ohmic resistance). In general, for non-superconducting materials, the frequency at which the impedance contribution of this inductance becomes significant compared to the resistance is relatively large (>1 THz). Hence one can generally safely neglect kinetic inductance for normal electronics (although this is not necessarily the case with conductors used in RF circuits).

A multi-walled carbon nanotube with a diameter of 25 nm has a kinetic inductance of ~0.48 nH/μm. If the nanotube network 415 comprises 2000 nanotubes per layer, the kinetic inductance is reduced to 240 fH/μm, and can be ignored. The magnetic inductance of a 50Ω conductor is also around 240 fH/μm. However, because the nanotube network 415 will typically comprise multiple layers of nanotubes, the magnetic inductance will be greater than the kinetic inductance and therefore cannot be ignored.

A technique used to suppress common mode current is to incorporate a defected ground structure 518 (DGS) in the ground plane 523 of the PWB. A DGS 518 is an intentionally designed defect on a ground plane 523 which creates additional effective inductance and capacitance. This can be used to design microstrip lines with desired characteristics such as higher impedance, band rejection and slow-wave characteristics, whilst significantly reducing the footprint of the microstrip structure. DGS structures 518 are often used in RF/microwave components such as filters, dividers, amplifiers and high-speed digital designs.

Figure 5:
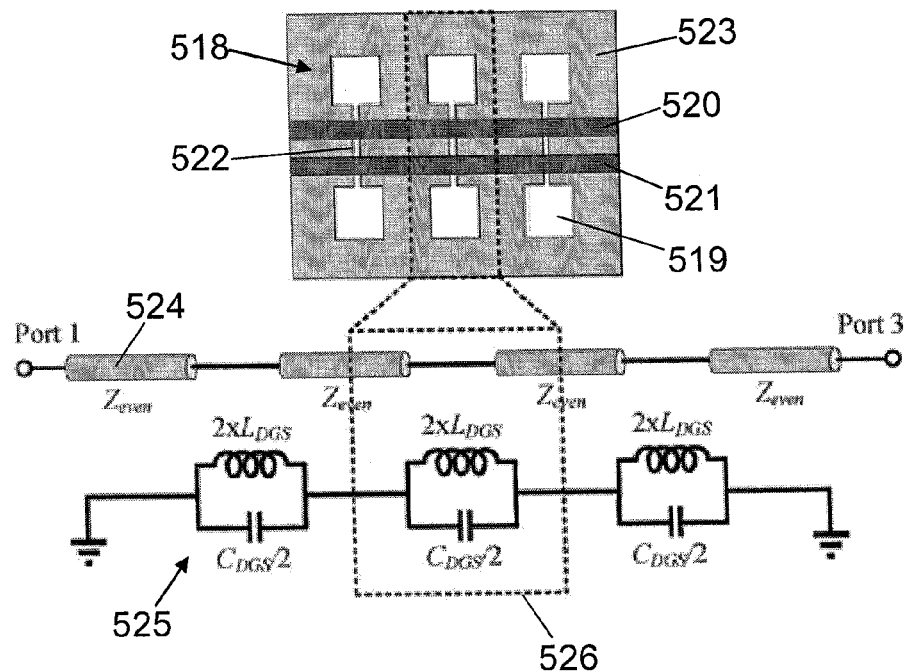
FIG. 5 illustrates schematically a defected ground structure configured to couple common mode signals.

One example of an existing DGS 518 is illustrated schematically in FIG. 5. The DGS 518 is formed by etching pairs of dumbbells 519 beneath the differential signal strips 520, 521. To avoid the excitation of common mode noise, the structure 518 is made symmetrical with respect to the central line of the two signal strips 520, 521. As can be seen from this figure, the dumbbells 519 in each pair are connected by an etched slit 522. The general idea is to create a structure that forms a high-impedance path for common mode current. By filtering out common mode current, any electromagnetic fields that would normally be produced by the current are prevented. In effect, this allows the differential signals to propagate along the signal strips 520, 521 without interference.

Figure 2A:
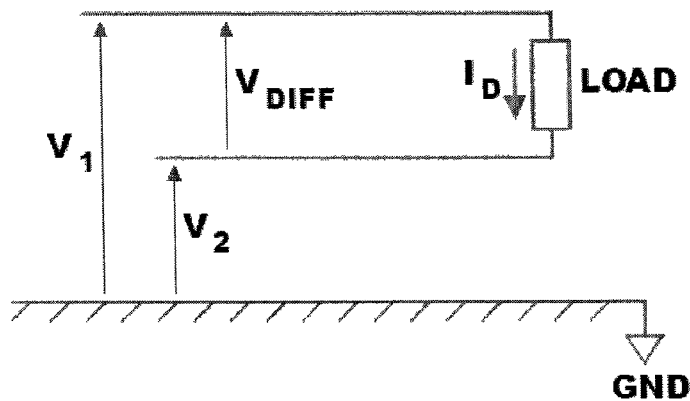
FIG. 2a illustrates schematically differential mode signals.
Figure 2B:
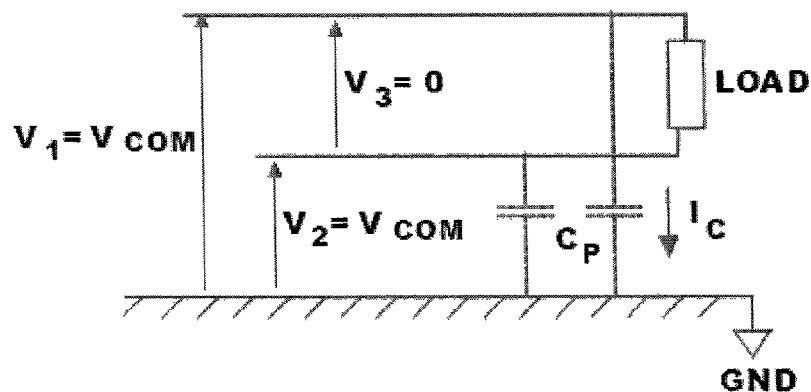
FIG. 2b illustrates schematically common mode signals.

Since the differential signal is odd mode, relatively low current density returns through the ground plane 523 (as described with respect to FIG. 2a). Therefore, the degradation of the differential signals caused by the DGS 518 is relatively small. However, the return current associated with any common mode (or even mode) signal will pass through the ground plane 523 (as described with respect to FIG. 2b), and the DGS 518 will cause significant attenuation of the signal. The unit cell 526 of the differential transmission line with dumbbell-shaped DGS 518 may therefore be considered as an ideal transmission line with common mode characteristic impedance 524 ($Z_{even}$) and an LC resonator 525 located on the ground plane 523. $C_{DGS}$ and $L_{DGS}$ denote the gap capacitance between two sides of the slit 522 and the equivalent inductance of the signal passing through the DGS 518, respectively. Experiments show that common mode noise can be significantly blocked at the frequency range close to the resonance frequency of the LC resonator 525, $\omega_0 = 1/\sqrt{L_{DGS}C_{DGS}}$.

Figure 6:
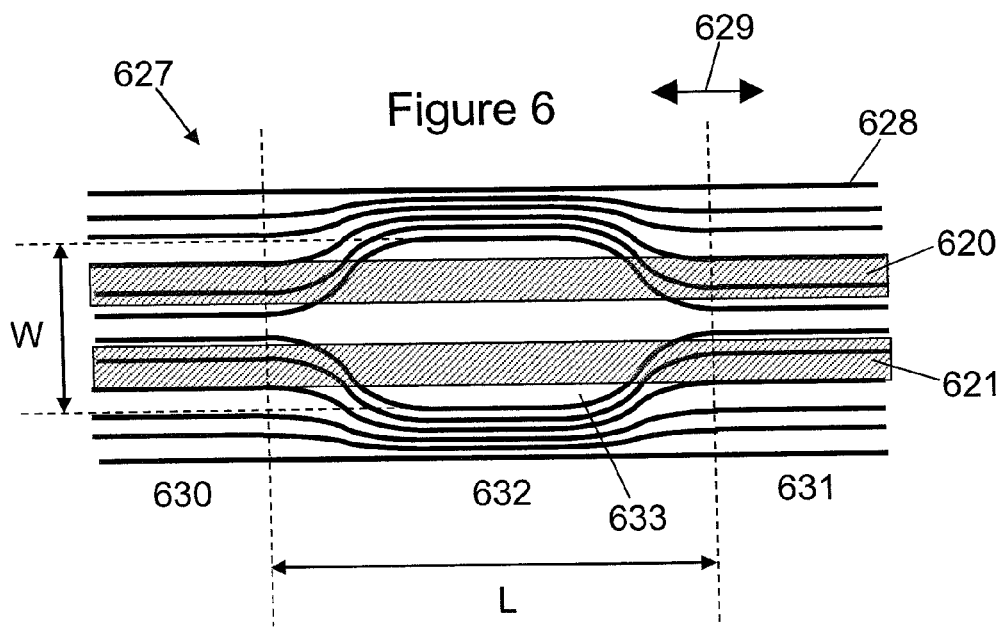
FIG. 6 illustrates schematically a network of nanotubes configured to couple common mode signals.

A different type of ground structure for filtering common mode current can be formed using a network 627 of nanotubes 628 with respective longitudinal axes 629, as illustrated in FIG. 6. This time, the nanotubes 628 have first 630 and third 631 portions where their longitudinal axes 629 are aligned substantially parallel to one another, and a second portion 632 where the nanotubes are configured to form a disturbance 633 in the parallel alignment adjacent to the signal strips 620, 621. The disturbance 633 in the parallel alignment couples the common mode current flowing through the nanotube network 627 (ground plane). In this way, the common mode current oscillates in the disturbance 633 and is dissipated by the nanotube network 627. For purely differential signals, the disturbance 633 has, in theory, no effect. The term "disturbance" as used to describe the nanotube configuration may be taken to mean a deviation from the parallel alignment to form an opening or hole in the nanotube network. The opening or hole may or may not extend through the complete thickness of the material.

The minimum width (W) of the opening formed by the disturbance 633 should be greater than four times the width of each signal strip 620, 621. In practice, the signal strips 620, 621 are 50 μm wide and are spaced apart from one another by 50 μm. In this scenario, an opening in the nanotube network 627 with a width of at least 400 μm would be suitable. Increasing the width of the opening further could improve the filter efficiency, and would cause the common mode current to resonate in the disturbance 633 at a different frequency.

The length (L) of the opening formed by the disturbance 633 should be greater than one tenth of the wavelength of the signal. Using the above-mentioned 50 μm wide signal strips 620, 621, a length of at least 400 μm would be suitable. Increasing the length of the opening further (up to a maximum of length of several millimeters) could improve the filter efficiency, and would also cause the common mode current to resonate in the disturbance 633 at a different frequency.

Another aspect of EMC is electromagnetic shielding. Electromagnetic shielding is the process of reducing the electromagnetic field in a space by blocking the field with barriers made from conductive materials. Shielding is typically applied to enclosures to isolate electrical devices from the "outside world", and to cables to isolate wires from the environment through which the cable runs. The shielding can reduce the coupling of radio waves, electromagnetic fields and electrostatic fields.

Electromagnetic radiation consists of coupled electric and magnetic fields. The electric field produces forces on the charge carriers (electrons) within the conductor (shield). When an electric field is applied to the surface of an ideal conductor, it induces a current that causes displacement of charge inside the conductor. The displacement of charge then cancels the applied field inside the conductor, at which point the current stops. Similarly, varying magnetic fields generate eddy currents in the conductor that act to cancel the applied magnetic field. The overall result is that electromagnetic radiation is reflected from the surface of the conductor: internal fields remaining inside the conductor, and external fields remaining outside the conductor.

Figure 7:
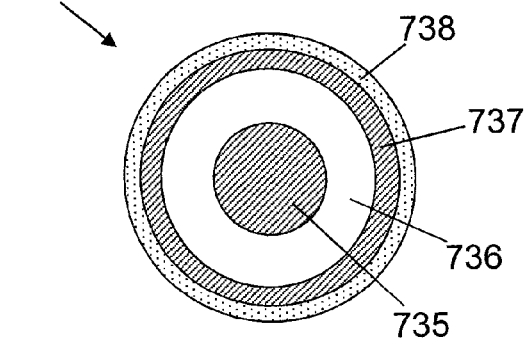
FIG. 7 illustrates schematically a co-axial cable.

A common example of electromagnetic shielding can be seen in a coaxial cable 734, as shown in cross-section in FIG. 7. A co-axial cable 734 is an electrical cable with an inner conductor 735 surrounded by an insulating layer 736, an outer conductor 737, and a protective sheath 738. Like any electrical power cord, coaxial cables 734 conduct AC electrical current between different locations. If an ordinary wire is used to carry high frequency currents, the wire acts as an antenna, and the high frequency currents radiate off the wire as radio waves. To prevent this, the outer conductor 737 of a coaxial cable 734 is formed into a tube and encloses the inner conductor 735. This confines the radio waves from the inner conductor 735 to the space inside the tube. To prevent the outer conductor 737 (or shield) from radiating, it is connected to electrical ground.

The dimensions and spacing of the conductors 735, 737 must be uniform throughout the length of the cable 734, otherwise RF power is reflected back towards the source causing the formation of standing waves. This acts as a bottleneck, reducing the amount of power reaching the destination end of the cable 734. The insulating layer 736 is therefore used to hold the outer conductor 737 at a uniform distance from the inner conductor 735.

Figure 8:
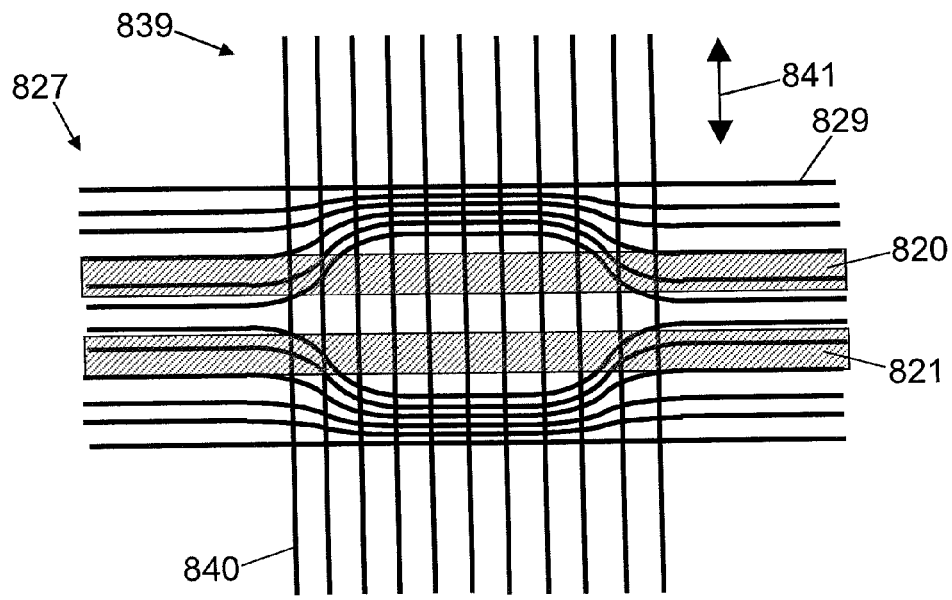
FIG. 8 illustrates schematically a network of nanotubes configured to shield the conductive layer of a printed wiring board from electromagnetic interference.

A nanotube network can be used to shield a PWB from electromagnetic interference in a similar way to the outer conductor 738 of a coaxial cable 734. FIG. 8 shows the ground layer 827 of FIG. 6 with an additional second conductive layer 839. The second conductive layer 839 comprises a network of nanotubes 840 with respective longitudinal axes 841, the nanotubes 840 arranged such that their longitudinal axes 841 are aligned substantially parallel to one another. The nanotubes 840 of the second conductive layer 839 are aligned substantially perpendicular to the nanotubes 828 of the ground layer 827 to conduct current away from the signal strips 820, 821. This configuration helps to minimise the effect of electromagnetic radiation, produced by current travelling in the second conductive layer 839, on the differential signals travelling in the signal strips 820, 821.

In order to shield the conductive layers of the PWB from external electromagnetic fields, the nanotube network (second conductive layer 839) should be positioned near the top or bottom of the stack (e.g. as the uppermost or lowermost conductive layer), but it could be positioned elsewhere in the PWB stack. The second conductive layer 839 should also be sufficiently distanced from the signal strips 820, 821 and the ground layer 827 so as not to interfere with the propagation of differential signals or the filtering of common mode signals, respectively.

Furthermore, the average length of the nanotubes in the second conductive layer 839 may be chosen to control the number of discontinuities in the nanotube network and therefore the electrical conductivity. For example, the average length of the nanotubes may be less than 3 mm, less than 5 mm, or less than 10 mm. In this way, current generated in the second conductive layer 839 by unwanted electromagnetic fields may be largely dissipated by the nanotube network. This configuration helps to minimise electromagnetic radiation produced by current travelling in the second conductive layer 839 which could otherwise adversely affect the differential signals travelling in the signal strips 820, 821.

Each trace in a PWB has a characteristic impedance depending on the material and dimensions used to form the trace. The characteristic impedance is the ratio of voltage to current in the trace. In order to prevent reflections at the destination end of the trace from causing standing waves, any connected components must present an impedance equal to the characteristic impedance. This is called "impedance matching". In this way, the electrical component appears as a continuation of the trace, and there is no reflection. A common impedance value for PWB traces is 50Ω.

Metallic ground planes 942 often have impedance values of below the 50Ω. In order to increase their impedance, PWB manufacturers sometimes introduce holes 943 in the ground plane 942 to form a mesh 944 (illustrated in FIG. 9). When current flows in the ground plane 942, it is forced to travel around the holes 943 in the mesh 944. As a result, current loops are formed in the ground plane 942, which generate magnetic fields. Under Lenz's law, the magnetic fields act to impede the flow of current which produced them. This has the effect of increasing the self-inductance of the ground plane 942. Furthermore, because the current is forced to travel around the holes 943, the distance between the current travelling in the ground plane 942, and the current travelling in the signal strips increases. This has the effect of decreasing the capacitance between the ground plane 942 and the signal strips. Overall, since impedance (for a lossless transmission line) is given by $Z=\sqrt{L/C}$, the impedance of the ground plane 942 is increased by using a mesh 944.

Another reason for increasing impedance is power consumption. By using a 25Ω trace and a 200 mV signal, 8mA of current flows through the trace. The power consumption associated with generating this 200 mV signal is therefore 1.6 mW. If, on the other hand, the impedance of the trace is increased to 50Ω, the current and power consumption are reduced to 4 mA and 0.8 mW, respectively.

Figure 10:
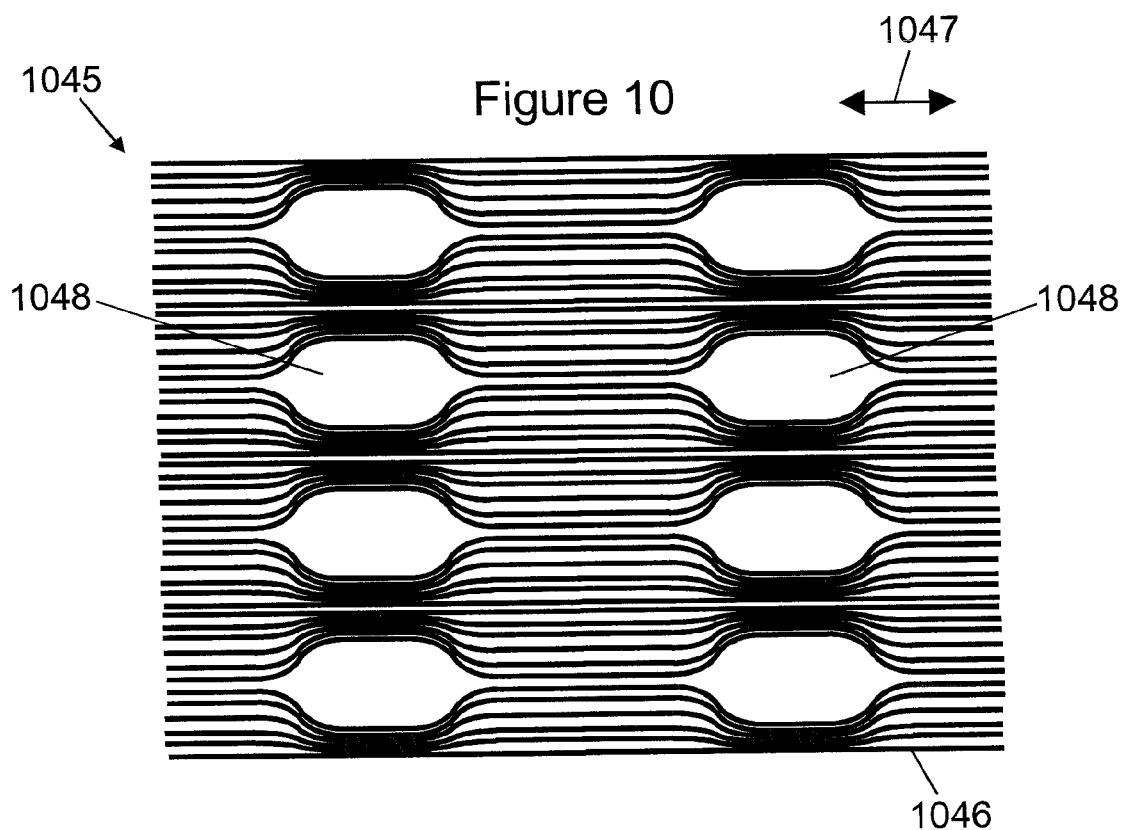
FIG. 10 illustrates schematically a nanotube network configured to have a particular impedance value.

A similar result can be achieved when a nanotube network 1045 is used as the ground layer. As illustrated in FIG. 10, the ground layer comprises a network of nanotubes 1046 with respective longitudinal axes 1047, the nanotubes 1046 arranged such that their longitudinal axes 1047 are aligned substantially parallel to one another. To provide a particular impedance value (e.g. 50Ω), the nanotube network 1045 is configured to comprise a predefined disturbance 1048 in the parallel alignment. In the example shown, the nanotube network 1045 is configured to comprise a plurality of predefined disturbances 1048 distributed at predefined intervals across the ground layer. These predefined disturbances 1048 may or may not be evenly spaced. Furthermore, the number and dimensions of the disturbances 1048 can be varied to achieve the desired impedance value.

To achieve the desired impedance value (by increasing the inductance and decreasing the capacitance), the in-plane dimensions (length and width) of the holes in the ground plane should be the same as the width of the signal strips, if not greater.

Figure 9:
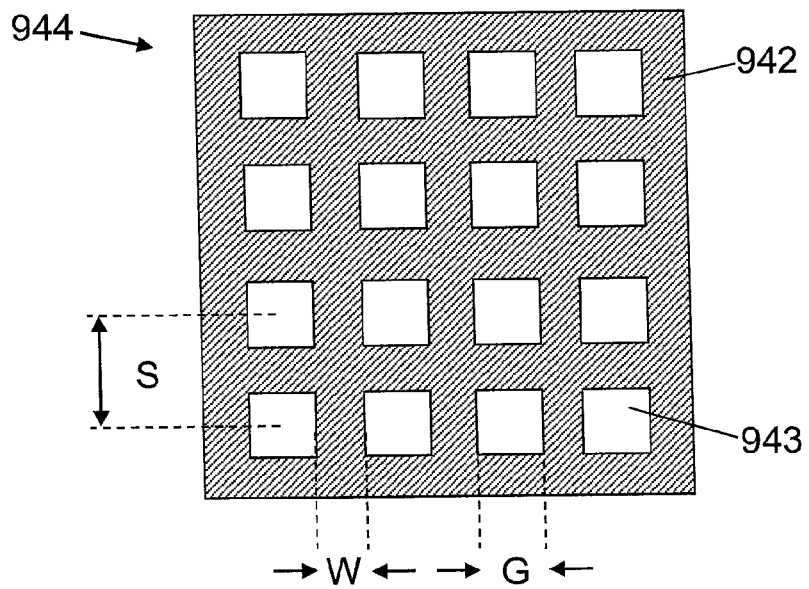
FIG. 9 illustrates schematically a meshed ground plane.

The maximum size of each hole is limited, however, by the mesh aperture ratio (MAR). The mesh aperture ratio is given by the equation, MAR=W/W+G, where "W" is the width of the metal strips forming the ground plane, and "G" is the width of the holes (assuming that the length and width of the holes are the same). These dimensions are illustrated in FIG. 9. For optimum performance (i.e. minimum line loss and maximum signal integrity), the mesh aperture ratio should be as high as possible (preferably 67% at least).

Furthermore, the maximum size of the holes is also limited by the rise time ($T_r$) of the signal. The size of the holes in the ground plane is therefore chosen to provide a compromise between desired impedance and performance, without exceeding the maximum dimension for the rise time of the signal.

The maximum width (G), and the maximum centre-to-centre spacing (S), are shown in the table below for a variety of different rise times. The width (W) of the metal and the mesh aperture ratio (MAR) are also shown. These measurements were taken using a printed wiring board comprising a dielectric layer of FR4 with a dielectric constant of 4.0 between the signal strips and the ground plane.

| $T_r$ (ps) | W (μm) | G (μm) | S (μm) | MAR (%) |
|---|---|---|---|---|
| 10 | 100 | 50  | 150 | 67 |
| 20 | 200 | 100 | 300 | 67 |
| 30 | 300 | 150 | 450 | 67 |
| 40 | 400 | 200 | 600 | 67 |
| 50 | 500 | 250 | 750 | 67 |

Therefore, for 50 μm wide signal strips, a mesh aperture ratio of 67%, and a rise time of 10 ps, a suitable size (length and width) for the holes is 50 μm with a centre-to-centre spacing of 150 μm.

Figure 11A:
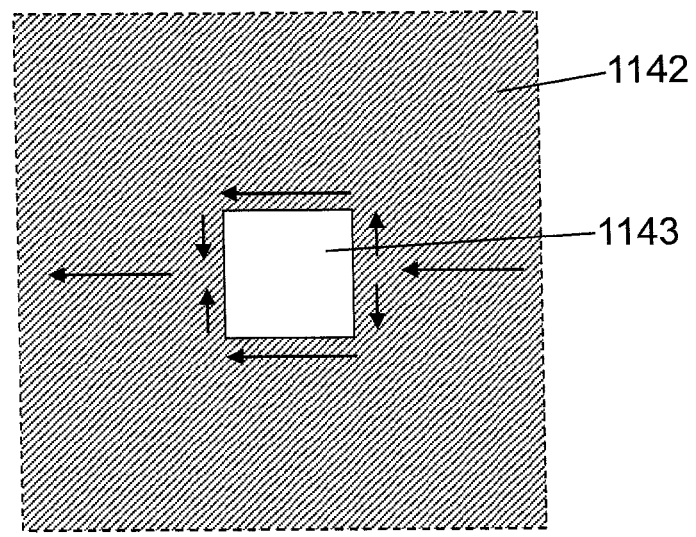
FIG. 11*a* illustrates schematically the flow of electrical current around a predefined hole formed in the meshed ground plane of FIG. 9.
Figure 11B:
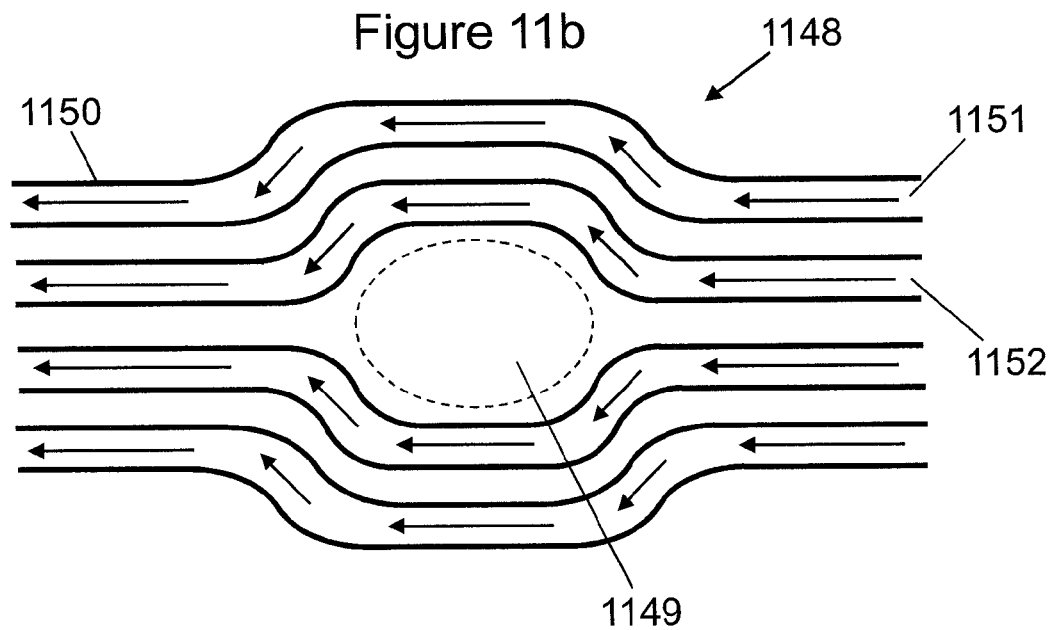
FIG. 11*b* illustrates schematically the flow of electrical current around a predefined disturbance formed in the nanotube network of FIG. 10.

In comparison to the metallic mesh shown in FIG. 9, the opening 1149 at the centre of each disturbance 1148 in the nanotube network can be smaller than the holes 1143 in the metal ground plane 1142. In the metal ground plane 1142, the current is strongly concentrated into the edges of the holes 1143 as a result of the skin effect at high AC frequencies. This is illustrated in FIG. 11a. In contrast, because the electrical coupling between adjacent nanotubes 1151, 1152 is small, each nanotube 1151, 1152 in the network behaves relatively independently. As a result, when current flows through the nanotube network, it is confined by the walls 1150 of each nanotube 1151, 1152 and is unable to concentrate at the edges of the opening 1149 (i.e. at the innermost nanotube 1152). In this way, each disturbance 1148 creates a current loop which is larger in size than the opening 1149 at the centre of the disturbance 1148. In this way, the nanotube network can provide the same increase in impedance using smaller openings 1149 than the holes in the metal ground plane 1142. This helps to improve signal propagation at higher frequencies and enables faster rise times.

To form the nanotube networks described herein, an array of vertical nanotubes are grown on a substrate (e.g. using chemical vapour deposition). Following their growth, the nanotubes are drawn from the substrate and spun together using a process which is analogous to that used in the textile industry. To improve the mechanical integrity of the nanotube network, a supporting material, such as a polymer, is then added to the network to bind the nanotubes. This may be performed by polymerisation of monomers in the space between the nanotubes, by fusing the nanotube network onto a layer of polymer under applied heat and pressure, or by attaching an adhesive material to the nanotube network. The supporting material also improves surface adhesion of the nanotube network so that it can be applied to a PWB. Further details of the fabrication process may be found in the patent application US 2011/0008240 A1 (Inoue).

Figure 12:
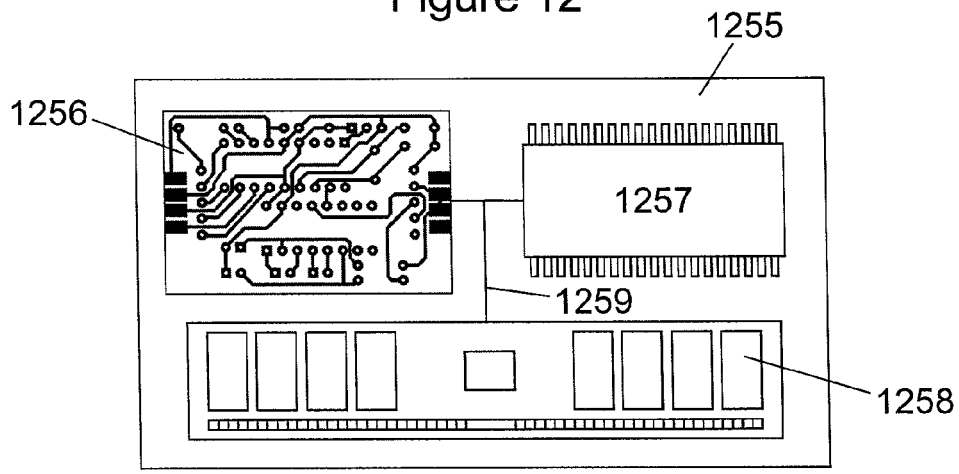
FIG. 12 illustrates schematically a device comprising a printed wiring board described herein.

FIG. 12 illustrates schematically a device 1255 comprising a printed wiring board 1256 (PWB) described herein. The device 1255 also comprises a processor 1257 and a storage medium 1258, which are electrically connected to one another by a data bus 1259. The device 1255 may be an electronic device, a portable electronic device, a portable telecommunications device, or a module for any of the aforementioned devices.

At least one conductive layer (e.g. the ground layer) of the PWB 1356 comprises a nanotube network. The nanotube network may be configured such that electrical current passing through the conductive layer along a first axis substantially parallel to the longitudinal axes of the nanotubes experiences one degree of dissipation, and electrical current passing through the conductive layer along a second axis experiences a higher degree of dissipation.

Additionally or alternatively, the nanotube network may comprise first and second portions where the longitudinal axes of the nanotubes are aligned substantially parallel to one another, and a second portion where the nanotubes are configured to form a disturbance in the parallel alignment adjacent the signal strip to couple common mode current flowing in the ground layer.

Additionally or alternatively, the nanotube network may be configured to shield the PWB 1256 from electromagnetic interference. In this scenario, the nanotube network may be positioned between the ground layer and the signal strips to prevent any electromagnetic fields emanating from the ground layer from interfering with the signal strips. On the other hand, the nanotube network may form the lowermost or uppermost conductive layer in the PWB stack to shield the other conductive layers from external electromagnetic fields.

Additionally or alternatively, the nanotube network may be configured to comprise a predefined disturbance in the parallel alignment to provide a particular impedance value for the ground layer.

The different nanotube configurations described above may be formed within one or more conductive layers of the PWB 1256.

The processor 1257 is configured for general operation of the device 1255 by providing signalling to, and receiving signalling from, the other device components to manage their operation. In particular, the processor 1257 may be configured to control the current and voltage of electrical signals passing through the PWB 1256, and to direct the electrical signals through different conductive layers of the PWB stack. Where a conductive layer has an anisotropic electrical conductivity, the processor 1257 may also be configured to control the direction of current through the conductive layer.

The storage medium 1258 is configured to store computer code configured to perform, control or enable operation of the device 1255, as described with reference to FIG. 14. In addition, the storage medium 1258 may be configured to store settings for the other device components. In this scenario, the processor 1257 may access the storage medium 1258 to retrieve the component settings in order to manage operation of the other device components. The storage medium 1258 may be a temporary storage medium such as a volatile random access memory. On the other hand, the storage medium 1258 may be a permanent storage medium such as a hard disk drive, a flash memory, or a non-volatile random access memory.

Figure 13:
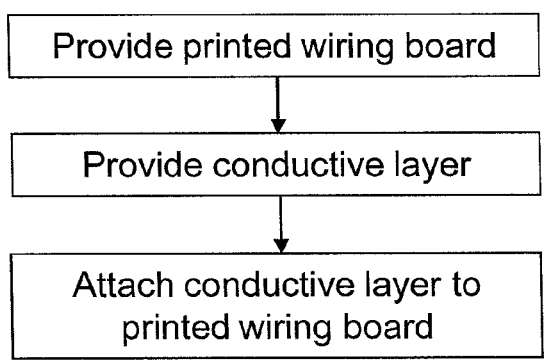
FIG. 13 illustrates schematically a method for making a printed wiring board described herein.

The main steps of the method used to make the PWB 1256 are illustrated schematically in FIG. 13. Reference to a "conductive layer" in this figure may be taken to include the ground layer.

Figure 14:
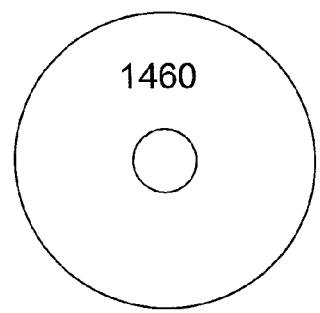
FIG. 14 shows a computer readable medium providing a program for controlling the making of a printed wiring board described herein.

FIG. 14 illustrates schematically a computer/processor readable medium 1460 providing a computer program according to one embodiment. In this example, the computer/processor readable medium 1460 is a disc such as a digital versatile disc (DVD) or a compact disc (CD). In other embodiments, the computer/processor readable medium 1460 may be any medium that has been programmed in such a way as to carry out an inventive function. The computer/processor readable medium 1460 may be a removable memory device such as a memory stick or memory card (SD, mini SD or micro SD).

The computer program may comprise computer code configured to perform, control or enable one or more of the following: provision of a printed wiring board; provision of a conductive layer, the conductive layer comprising a network of nanotubes with respective longitudinal axes, the nanotubes arranged such that their longitudinal axes are aligned substantially parallel to one another in a configuration such that electrical current passing through the conductive layer along a first axis substantially parallel to the longitudinal axes of the nanotubes experiences one degree of dissipation, and electrical current passing through the conductive layer along a second axis experiences a higher degree of dissipation; and attachment of the conductive layer to the printed wiring board.

The computer program may also comprise computer code configured to perform, control or enable one or more of the following: provision of a printed wiring board, the printed wiring board comprising a signal strip; provision of a ground layer, the ground layer comprising a network of nanotubes with respective longitudinal axes, the nanotubes having first and third portions where their longitudinal axes are aligned substantially parallel to one another, and a second portion where the nanotubes are configured to form a disturbance in the parallel alignment adjacent the signal strip to couple common-mode current flowing in the ground layer; and attachment of the ground layer to the printed wiring board.

The computer program may also comprise computer code configured to perform, control or enable one or more of the following: provision of a printed wiring board; provision of a ground layer, the ground layer comprising a network of nanotubes with respective longitudinal axes, the nanotubes arranged such that their longitudinal axes are aligned substantially parallel to one another, wherein the network is configured to comprise a predefined disturbance in the parallel alignment to provide a particular impedance value for the ground layer; and attachment of the ground layer to the printed wiring board.

Other embodiments depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

It will be appreciated to the skilled reader that any mentioned apparatus/device/server and/or other features of particular mentioned apparatus/device/server may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device/server may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that the any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:
1. A printed wiring board, comprising:
a conductive layer, the conductive layer comprising a network of multi-walled carbon nanotubes with respective longitudinal axes, the nanotubes arranged such that their longitudinal axes are aligned substantially parallel to one another in a configuration such that electrical current passing through the conductive layer along a first axis substantially parallel to the longitudinal axes of the nanotubes experiences one degree of dissipation, and electrical current passing through the conductive layer along a second axis substantially perpendicular to the longitudinal axes of the nanotubes experiences a higher degree of dissipation; and a signal strip arranged with the conductive layer;

wherein the substantially perpendicular alignment of the second axis to the longitudinal axes of the nanotubes is configured to conduct current away from the signal strip;

wherein the conductive layer is configured to have an anisotropic electrical conductivity with a ratio of up to 10:1 along the first and second axes, respectively.

2. The printed wiring board of claim 1, wherein the conductive layer has a planar structure, and wherein the first and second axes lie substantially in the plane of the conductive layer.

3. The printed wiring board of claim 1, wherein the printed wiring board is configured such that the conductive layer serves as a ground layer when electrical current is passed through the conductive layer along the first axis, and as a lossy layer when electrical current is passed through the conductive layer along the second axis.

4. The printed wiring board of claim 1, wherein the current is an alternating current having a frequency of up to 50 GHz.

5. The printed wiring board of claim 1, wherein the conductive layer comprises a supporting material configured to increase the mechanical integrity of the conductive layer.

6. The printed wiring board of claim 1, wherein the conductive layer comprises an adhesive to facilitate adhesion of the conductive layer to another layer of the printed wiring board.

7. The printed wiring board of claim 1, wherein the printed wiring board comprises a second conductive layer, the second conductive layer comprising a network of nanotubes with respective longitudinal axes, the nanotubes arranged such that their longitudinal axes are aligned substantially parallel to one another, wherein the second conductive layer is configured to shield the printed wiring board from electromagnetic interference.

8. The printed wiring board of claim 7, wherein the nanotubes of the second conductive layer are aligned substantially perpendicular to the nanotubes of the conductive layer.

9. A device comprising the printed wiring board of claim 1.

10. The device of claim 9, wherein the device is one or more of the following: an electronic device, a portable electronic device, a portable telecommunications device, and a module for any of the aforementioned devices.

11. A method of making a printed wiring board, the method comprising:

providing a printed wiring board;

providing a conductive layer, the conductive layer comprising a network of multi-walled carbon nanotubes with respective longitudinal axes, the nanotubes arranged such that their longitudinal axes are aligned substantially parallel to one another in a configuration such that electrical current passing through the conductive layer along a first axis substantially parallel to the longitudinal axes of the nanotubes experiences one degree of dissipation, and electrical current passing through the conductive layer along a second axis substantially perpendicular to the longitudinal axes of the nanotubes experiences a higher degree of dissipation;

providing a signal strip arranged with the conductive layer; and attaching the conductive layer to the printed wiring board;

wherein the substantially perpendicular alignment of the second axis to the longitudinal axes of the nanotubes is configured to conduct current away from the signal strip;

wherein the conductive layer is configured to have an anisotropic electrical conductivity with a ratio of up to 10:1 along the first and second axes, respectively.

* * * * *